(12) United States Patent
Park et al.

(10) Patent No.: US 8,040,201 B2
(45) Date of Patent: Oct. 18, 2011

(54) SUBSTRATE HAVING A STRUCTURE FOR SUPPRESSING NOISE GENERATED IN A POWER PLANE AND/OR A GROUND PLANE, AND AN ELECTRONIC SYSTEM INCLUDING THE SAME

(75) Inventors: Kwang-Soo Park, Suwon-si (KR); Byoung-Ha Oh, Yongin-si (KR); Yong-Ho Ko, Jeju-si (KR)

(73) Assignee: Samsung Electronics Co., Ltd., Suwon Si (KR)

( * ) Notice: Subject to any disclaimer, the term of this patent is extended or adjusted under 35 U.S.C. 154(b) by 360 days.

(21) Appl. No.: 12/354,488

(22) Filed: Jan. 15, 2009

(65) Prior Publication Data

US 2009/0184778 A1 Jul. 23, 2009

(30) Foreign Application Priority Data

Jan. 17, 2008 (KR) .................. 10-2008-0005382

(51) Int. Cl.
*H04B 3/30* (2006.01)
*H01P 3/08* (2006.01)

(52) U.S. Cl. ......................................... 333/12; 333/238

(58) Field of Classification Search ................ 333/12, 333/238
See application file for complete search history.

(56) References Cited

U.S. PATENT DOCUMENTS

| 6,496,886 B1 * | 12/2002 | Osaka et al. ................ 710/100 |
| 6,677,831 B1 * | 1/2004 | Cheng et al. ................... 333/34 |
| 6,873,219 B2 * | 3/2005 | Grebenkemper ............... 333/12 |
| 7,202,758 B2 * | 4/2007 | Hsu ................................ 333/33 |
| 2003/0201472 A1 | 10/2003 | Ho |

FOREIGN PATENT DOCUMENTS

| JP | 11-145569 | 5/1999 |
| KR | 100341077 | 6/2002 |
| KR | 1020020074573 | 10/2002 |

* cited by examiner

*Primary Examiner* — Robert Pascal
*Assistant Examiner* — Kimberly Glenn
(74) *Attorney, Agent, or Firm* — F. Chau & Associates, LLC (57) ABSTRACT

A substrate includes a power plane and a ground plane that are placed apart from and are substantially parallel to each other, and at least one signal line that is placed between the power plane and the ground plane. The ground plane includes a first conductive layer having a first conductivity. The power plane includes a second conductive layer having the first conductivity, and the power plane or the ground plane includes a third conductive layer having a second conductivity lower than the first conductivity. The third conductive layer faces the at least one signal line across a dielectric substance.

21 Claims, 10 Drawing Sheets

SUBSTRATE HAVING A STRUCTURE FOR SUPPRESSING NOISE GENERATED IN A POWER PLANE AND/OR A GROUND PLANE, AND AN ELECTRONIC SYSTEM INCLUDING THE SAME

CROSS-REFERENCE TO RELATED APPLICATION

This application claims priority under 35 U.S.C. §119 to Korean Patent Application No. 10-2008-0005382, filed Jan. 17, 2008 in the Korean Intellectual Property Office, the disclosure of which is incorporated by reference herein in its entirety.

BACKGROUND

1. Technical Field

The present invention relates to an electronic system, and more particularly, to a substrate having a power plane and a ground plane and an electronic system having the substrate.

2. Discussion of the Related Art

Parts of an electronic device or system may be assembled using a structure that includes conductive elements such as traces, terminals, vias, and the like. For example, the structure may be a planar structure such as a substrate or a printed circuit board (PCB).

For example, in a computer system, microprocessors and memory modules are coupled to a PCB such as a mother board. Because the microprocessors and the memory modules are electrically coupled to each other through the conductive elements (e.g., traces, terminals, and vias), the microprocessors and the memory modules can communicate with each other. The memory modules may each include a plurality of semiconductor device packages mounted on a PCB. This PCB allows the semiconductor device packages to communicate with each other.

A substrate having a planar structure may include conductive layers that are separated from each other by a dielectric substance. Some of the conductive layers may have conductive traces that run parallel with a surface of the substrate. The conductive traces may be formed on different layers. The conductive traces may be electrically coupled to each other through conductive vias that are perpendicular to a surface of the substrate. Generally, the substrate may include at least one power plane that provides a power voltage and at least one ground plane that provides a ground voltage.

A power transmission system can affect the performance of a high speed electronic system. Propagating waves may result when some of the semiconductor device packages in the memory modules perform simultaneous switching operations. The propagating waves may induce a drop in a power voltage that is applied to the semiconductor device packages that do not perform the switching operations. The propagating waves are sometimes referred to as simultaneous switching noise (SSN).

The power plane and/or the ground plane may operate as a waveguide or a transmission line with relation to a signal line. When the power plane and/or the ground plane operates as the waveguide or the transmission line, noise generated in the power plane and/or the ground plane may degrade a quality of a signal transferred through the signal line.

To suppress the noise generated in the power plane and/or the ground plane, and thus, prevent the degradation of signal quality, a capacitor can be added between the power plane and the ground plane, or the power plane and the ground plane can be made to have an electric band gap (EBG) structure.

However, the addition of the capacitor between the power plane and the ground plane may fail to suppress the noise at high frequencies because of a parasitic inductance of the capacitor. In addition, this technique may amplify the noise at frequencies, which cause a resonance between the capacitor and inductors that are placed between the power plane and the ground plane. The use of the power plane and the ground plane that have the EBG structure may fail to suppress the noise at low frequencies and may be expensive to manufacture.

Accordingly, there exists a need for a substrate with a structure that is capable of preventing quality degradation of a signal transferred through a signal line.

SUMMARY

In an exemplary embodiment of the present invention, a substrate includes a power plane and a ground plane that are placed apart from and are substantially parallel to each other, and at least one signal line that is placed between the power plane and the ground plane. The ground plane includes a first conductive layer having a first conductivity. The power plane includes a second conductive layer having the first conductivity, and the power plane or the ground plane includes a third conductive layer having a second conductivity lower than the first conductivity. The third conductive layer faces the at least one signal line across a dielectric substance.

A direct current may flow through the second conductive layer and the third conductive layer.

An alternating current may flow through the third conductive layer.

The alternating current may flow through the third conductive layer due to a high frequency skin effect.

A shortest distance between the at least one signal line and the ground plane may be shorter than a shortest distance between the at least one signal line and the power plane, or a shortest distance between that at least one signal line and the power plane is shorter than a shortest distance between the at least one signal line and the ground plane.

The at least one signal line may include a fourth conductive layer having the first conductivity.

The at least one signal line may further include a fifth conductive layer having the second conductivity. The fifth conductive layer may be adjacent to the fourth conductive layer and may face the third conductive layer across the dielectric substance.

A direct current may flow through the fourth conductive layer and the fifth conductive layer.

An alternating current may flow through the fifth conductive layer.

The at least one signal line may include a first signal line and a second signal line that are placed between the power plane and the ground plane and are placed apart from each other in a substantially horizontal direction.

A shortest distance from the first signal line or the second signal line to the ground plane may be shorter than a shortest distance from the first signal line or the second signal line to the power plane, or a shortest distance from the first signal line or the second signal line to the power plane is shorter than a shortest distance from the first signal line or the second signal line to the ground plane.

The ground plane or the power plane may further include a fourth conductive layer having the second conductivity. The fourth conductive layer may be adjacent to the first conductive layer when the ground plane includes the fourth conductive layer, or may be adjacent to the second conductive layer when the power plane includes the fourth conductive layer, and may have a void region over which the first signal line and the second signal line are placed.

The at least one signal line may include a first signal line and a second signal line placed in a fourth conductive layer between the ground plane and the power plane. The first signal line and the second signal line may be placed apart from each other in a substantially horizontal direction. A third signal line may be placed in a fifth conductive layer between the fourth conductive layer and the ground or power planes.

The first plane may further include a sixth conductive layer having the second conductivity. The sixth conductive layer may be adjacent to the first conductive layer when the ground plane includes the sixth conductive layer, or may be adjacent to the second conductive layer when the power plane includes the sixth conductive layer, and may have a void region over which the first signal line and the second signal line are placed.

The third conductive layer may have a void region over which the third signal line is placed.

In an exemplary embodiment of the present invention, a substrate includes a plane that provides a power voltage or a ground voltage, and at least one signal line that transfers a signal. The plane includes a first conductive layer having a first conductivity. The at least one signal line is placed apart from the plane and includes a second conductive layer having a second conductivity lower than the first conductivity.

The at least one signal line may include a third conductive layer having the first conductivity. The third conductive layer may be adjacent to the second conductive layer.

The second conductive layer may face the plane across a dielectric substance.

In an exemplary embodiment of the present invention, an electronic system includes a substrate including a power plane, a ground plane and at least one signal line, and a plurality of semiconductor devices electrically coupled to each other through the power plane, the ground plane, and the at least one signal line in the substrate. The power plane and the ground plane are placed apart from and are substantially parallel to each other. The ground plane includes a first conductive layer having a first conductivity. The power plane includes a second conductive layer having the first conductivity, and the ground plane or the power plane includes a third conductive layer having a second conductivity lower than the first conductivity. The at least one signal line is placed between the power plane and the ground plane. The third conductive layer faces the at least one signal line across a dielectric substance.

In an exemplary embodiment of the present invention, an electronic system includes a substrate including a plane and at least one signal line, and a plurality of semiconductor devices coupled electrically to each other through the plane, and the at least one signal line in the substrate. The plane provides a power voltage or a ground voltage. The plane includes a first conductive layer having a first conductivity. The at least one signal line transfers a signal. The at least one signal line is placed apart from the plane and includes a second conductive layer having a second conductivity lower than the first conductivity.

DETAILED DESCRIPTION OF EXEMPLARY EMBODIMENTS

Exemplary embodiments of the present invention will be described more fully hereinafter with reference to the accompanying drawings. This invention may, however, be embodied in many different forms and should not be construed as limited to the embodiments set forth herein.

Figure 1:
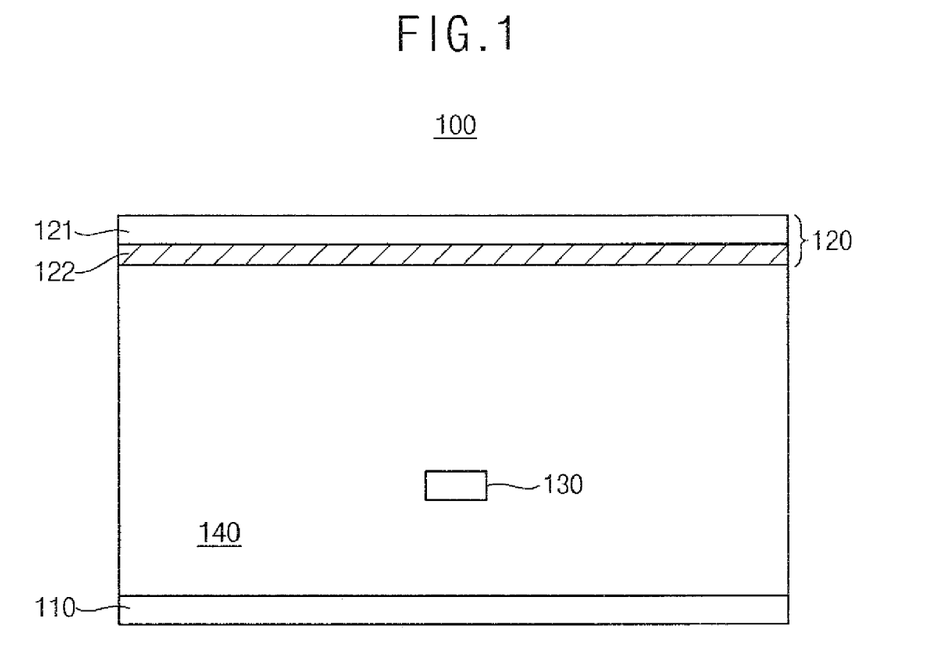
FIG. 1 illustrates a cross-sectional view of a substrate according to an exemplary embodiment of the present invention.

It will be understood that when an element is referred to as being "connected" or "coupled" to another element, it can be directly connected or coupled to the other element or intervening elements may be present. FIG. 1 illustrates a cross-sectional view of a substrate according to an exemplary embodiment of the present invention.

Referring to FIG. 1, the substrate 100 may include a ground plane 110, a power plane 120, and a signal line 130.

The ground plane 110 includes a first conductive layer having a first conductivity. The power plane 120 includes a second conductive layer 121 having the first conductivity and a third conductive layer 122 having a second conductivity lower than the first conductivity. The third conductive layer 122 is adjacent to the second conductive layer 121. The signal line 130 may have the first conductivity. For example, the first conductivity may be about $5.85 \times 10^7$ (mhos/m) when the first conductive layer 110 and the second conductive layer 121 are formed with copper and the second conductivity may be about $7.0 \times 10^7$ (mhos/m) when the third conductive layer 122 is formed with graphite. In this way, the third conductive layer 122 has a higher resistance (i.e., a lower conductivity)

than the second conductive layer 121. The second conductivity may be less than a tenth of the first conductivity.

In FIG. 1, the ground plane 110 and the power plane 120 may be alternated with each other. In other words, the reference numeral 110 may refer to the power plane and the reference numeral 120 may refer to the ground plane such that the ground plane further includes an additional conductive layer having a higher resistance than the other conductive layers.

The ground plane 110 provides a ground voltage and the power plane 120 provides a power voltage. The signal line 130 transfers a signal. The ground plane 110, the power plane 120, and the signal line 130 are separated from each other by a dielectric substance 140.

In the substrate 100 of FIG. 1, a shortest distance between the signal line 130 and the first conductive layer 110 is shorter than a shortest distance between the signal line 130 and the power plane 120. As a result, a loss of signal power due to the third conductive layer 122, which is used to suppress noise in the power plane 120, may be reduced.

A direct current from a power voltage may flow trough the ground plane 110 and the power plane 120 in the substrate 100 of FIG. 1 without loss, while noise having a relatively high frequency may be suppressed. The third conductive layer 122 in the power plane 120 has a surface that faces the first conductive layer 110.

Figure 2:
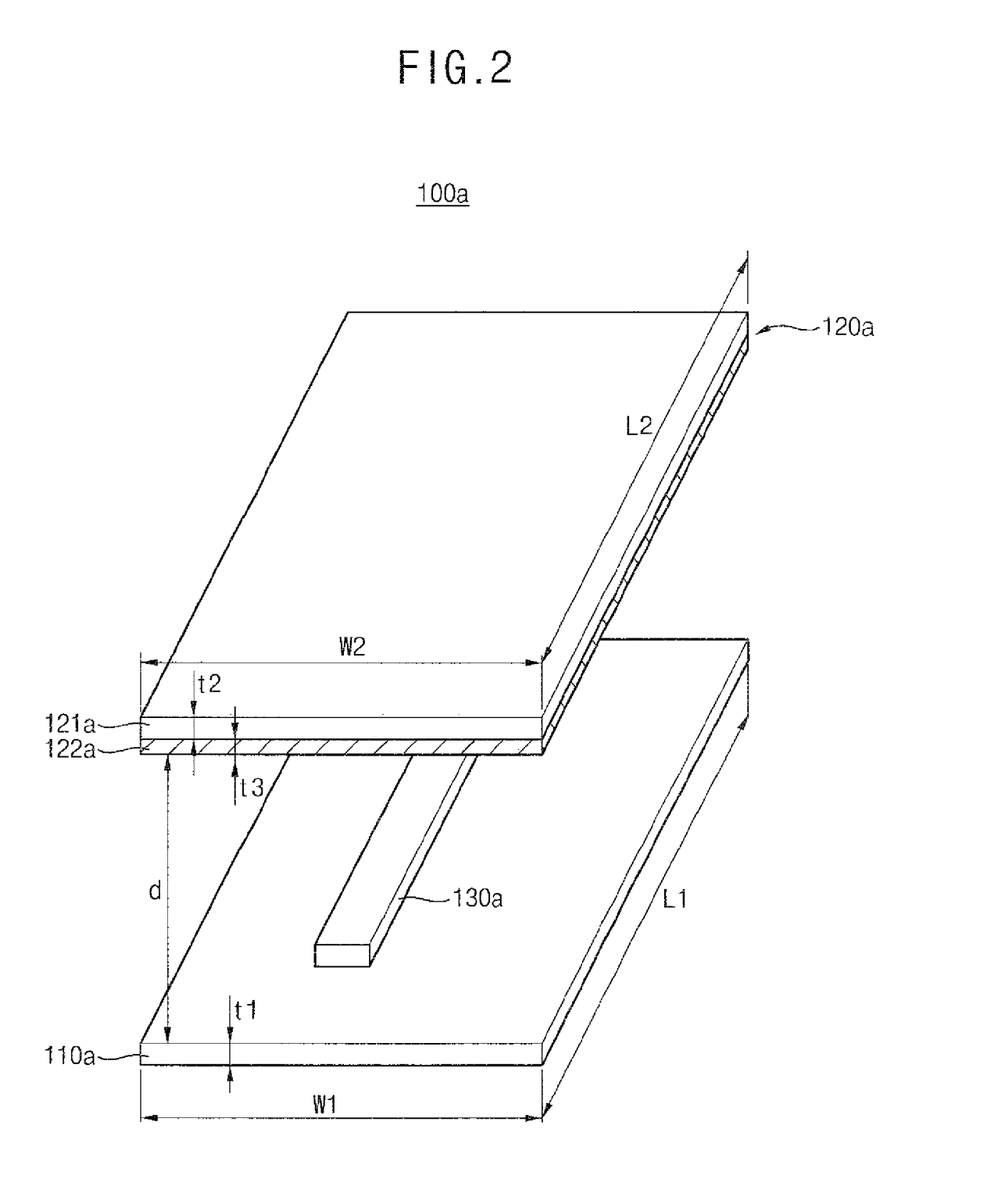
FIG. 2 illustrates a perspective view of the substrate of FIG. 1.

FIG. 2 illustrates a perspective view of the substrate of FIG. 1.

Referring to FIG. 2, the substrate 100a may include a ground plane 110a, a power plane 120a, and a signal line 130a.

The ground plane 110a has a width W1, a length L1, and a thickness t1. The power plane 120a includes a second conductive layer 121a and a third conductive layer 122a. The third conductive layer 122a is adjacent to the second conductive layer 121a. The power plane 120a has a width W2, and a length L2. The second conductive layer 121a has a thickness t2. The third conductive layer 122a has a thickness t3. The power plane 120a is separated from the ground plane 110a by a distance d and is placed in parallel to the ground plane 110a.

Hereinafter, an operation of the substrate 100 of FIG. 1 or the substrate 100a of FIG. 2 will be described in detail.

The power plane 120 of the substrate 100 includes two conductive layers having different conductivities. The conductive layers are joined together. The third conductive layer 122 that faces the first conductive layer 110 has a lower conductivity than the second conductive layer 121. In other words, the third conductive layer 122 has a higher resistance than the second conductive layer 121.

According to signal transmission theory, an alternating current tends to flow through a surface of a conductor as a frequency of the alternating current increases. This phenomenon is referred to as a skin effect. According to the skin effect, a signal is transferred through the cross-section of a conductor when the frequency is low. On the other hand, a signal is transferred through the surface of a conductor when the frequency is high.

Current flows through the power plane 120 are different according to whether the current is a direct current (DC) signal or an alternating current (AC) signal. When a DC signal (for example, a direct current from a DC power voltage) flows through the power plane 120, the DC signal flows through the cross-section of the power plane 120. On the other hand, when an AC signal of a relatively high frequency flows through the power plane 120, the AC signal flows through a surface of the power plane 120 due to the above-mentioned skin effect. Because the conductive layer having a surface that faces the signal line 130 is the third conductive layer 122 having a lower conductivity as compared with the second conductive layer 121, the high frequency AC signal flows mainly through the third conductive layer 122.

The power voltage provided through the power plane 120 is usually a DC voltage. Even if the power voltage includes AC components, the power voltage may have very low frequencies. Therefore, DC characteristics of the power plane 120 may not be changed even when the power plane 120 includes the third conductive layer 122 having the low conductivity. However, the noise of relatively high frequencies may be suppressed along the transmission direction due to the skin effect. As a result, the quality degradation of a signal transferred through the signal line 130 due to the noise generated in the power plane 120 may be prevented.

As mentioned above, the ground plane 110 and the power plane 120 may be alternated with each other in the substrate 100 of FIG. 1. Thus, the ground plane 110 further includes an additional conductive layer having a higher resistance than the other conductive layers.

Therefore, the substrate 100 of FIG. 1 may suppress the noise, particularly the simultaneous switching noise (SSN) noise generated in a power net, by including the conductors having different conductivities in the ground plane 110 or the power plane 120.

Figure 3:
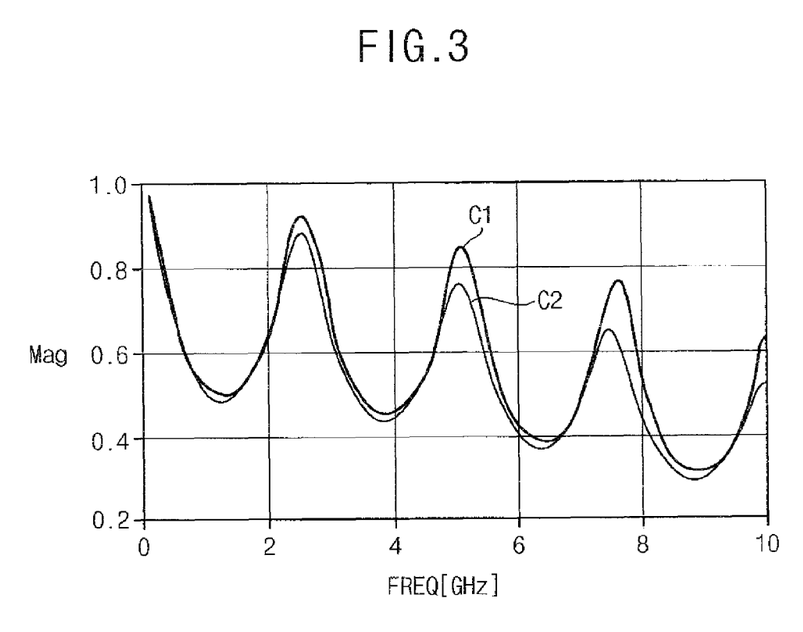
FIG. 3 is a graph illustrating an insertion loss of the substrate of FIG. 1 having a power plane or a ground plane that includes different conductive layers according to an exemplary embodiment of the present invention.

FIG. 3 is a graph illustrating an insertion loss of the substrate 100 of FIG. 1 having a power plane or a ground plane that includes different conductive layers according to an exemplary embodiment of the present invention.

Referring to FIG. 3, Mag refers to a power ratio at both terminals of a power plane and FREQ refers to a measured frequency. C1 refers to an insertion loss of a substrate in which a ground plane and a power plane both include a conductive layer having copper. C2 refers to an insertion loss of the substrate 100 of FIG. 1 in which the power plane 120 includes two conductive layers having different conductivities. The waveform C2 shows a simulation result for the substrate 100a of FIG. 2 under conditions where d is 800 um, t1 is 36 um, t2 is 36 um, t3 is 30 um, W1 and W2 are 10 mm, L1 and L2 are 20 mm, the conductivities of the first plane 110a and the second plane 121a are about $5.85 \times 10^7$ (mhos/m), and the conductivity of the third plane 122a is about $7.0 \times 10^7$ (mhos/m).

In FIG. 3, the insertion loss of the substrate 100 of FIG. 1 including the power plane 120 that includes two conductive layers having different conductivities is greater than the insertion loss of the conventional substrate including the power plane and the ground plane that include one conductive layer respectively. Thus, the substrate 100 of FIG. 1 may suppress the noise of relatively high frequencies along the transmission direction, particularly the SSN noise.

Figure 4:
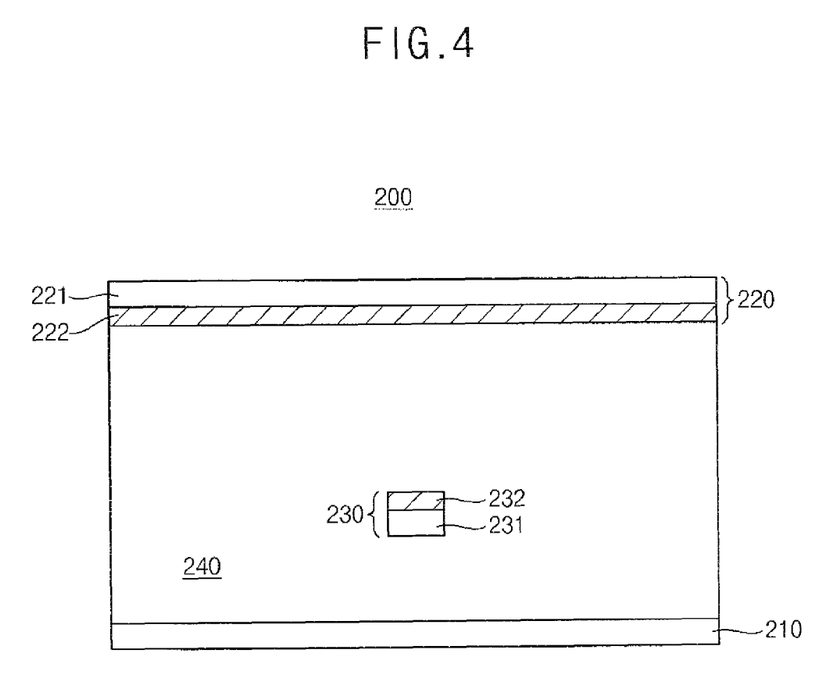
FIG. 4 illustrates a cross-sectional view of a substrate according to an exemplary embodiment of the present invention.

FIG. 4 illustrates a cross-sectional view of a substrate according to an exemplary embodiment of the present invention.

Referring to FIG. 4, the substrate 200 may include a ground plane 210, a power plane 220, and a signal line 230.

The ground plane 210 includes a first conductive layer having a first conductivity. The power plane 220 includes a second conductive layer 221 having the first conductivity and a third conductive layer 222 having a second conductivity lower than the first conductivity. The third conductive layer 222 is adjacent to the second conductive layer 221. For example, the first conductivity may be about $5.85 \times 10^7$ (mhos/m) when the first conductive layer 210 and the second conductive layer 221 are formed with copper and the second conductivity may be about $7.0 \times 10^7$ (mhos/m) when the third conductive layer 222 is formed with graphite. In this way, the third conductive layer 222 has a higher resistance (i.e., a lower conductivity) than the second conductive layer 221. The signal line 230 may include a fourth conductive layer 231 having the first conductivity and a fifth conductive layer 232 having the second conductivity. The fifth conductive layer 232 is adjacent to the fourth conductive layer 231.

The ground plane 210 provides a ground voltage. The power plane 220 provides a power voltage. The signal line 230 transfers a signal. The ground plane 210, the power plane 220, and the signal line 230 are separated from each other by a dielectric substance 240.

Figure 5:
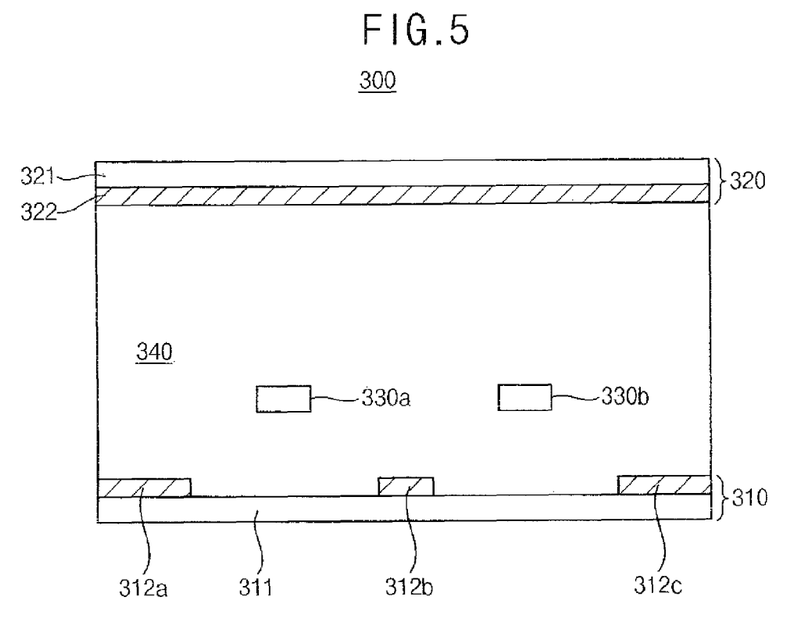
FIG. 5 illustrates a cross-sectional view of a substrate according to an exemplary embodiment of the present invention.

FIG. 5 illustrates a cross-sectional view of a substrate according to an exemplary embodiment of the present invention.

Referring to FIG. 5, the substrate 300 may include a ground plane 310, a power plane 320, and signal lines 330a and 330b.

The ground plane 310 includes a first conductive layer 311 having a first conductivity and a second conductive layer 312a, 312b, and 312c having a second conductivity lower than the first conductivity. The power plane 320 includes a third conductive layer 321 having the first conductivity, and a fourth conductive layer 322 having the second conductivity. The fourth conductive layer 322 is adjacent to the third conductive layer 321. For example, the first conductivity may be about $5.85 \times 10^7$ (mhos/m) when the first conductive layer 311 and the third conductive layer 321 are formed with copper and the second conductivity may be about $7.0 \times 10^7$ (mhos/m) when the second conductive layer 312a, 312b, and 312c and the fourth conductive layer 322 are formed with graphite. In this way, the second conductive layer 312a, 312b, and 312c has a higher resistance (i.e., a lower conductivity) than the first conductive layer 311, and the fourth conductive layer 322 has a higher resistance (i.e., a lower conductivity) than the third conductive layer 321. The signal lines 330a and 330b have the first conductivity.

The ground plane 310 provides a ground voltage. The power plane 320 provides a power voltage. The signal lines 330a and 330b transfer a signal. The ground plane 310, the power plane 320, and the signal lines 330a and 330b are separated from each other by a dielectric substance 340.

The second conductive layer 312a, 312b, and 312c having the second conductivity is adjacent to the first conductive layer 311. In addition, the second conductive layer 312a, 312b, and 312c has a void region over which the first signal line 330a and the second signal line 330b are placed.

Figure 6:
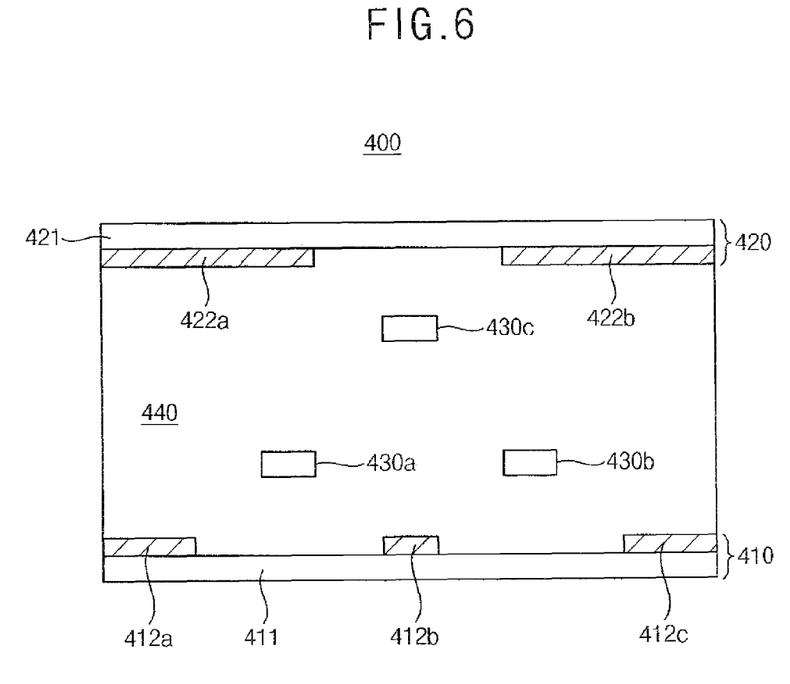
FIG. 6 illustrates a cross-sectional view of a substrate according to an exemplary embodiment of the present invention.

FIG. 6 illustrates a cross-sectional view of a substrate according to an exemplary embodiment of the present invention.

Referring to FIG. 6, the substrate 400 may include a ground plane 410, a power plane 420, and signal lines 430a, 430b, and 430c.

The ground plane 410 includes a first conductive layer 411 having a first conductivity and a second conductive layer 412a, 412b, and 412c having a second conductivity lower than the first conductivity. The power plane 420 includes a third conductive layer 421 having the first conductivity and a fourth conductive layer 422a and 422b having the second conductivity. The fourth conductive layer 422a and 422b is adjacent to the third conductive layer 421. For example, the first conductivity may be about $5.85 \times 10^7$ (mhos/m) when the first conductive layer 411 and the third conductive layer 421 are formed with copper and the second conductivity may be about $7.0 \times 10^7$ (mhos/m) when the second conductive layer 412a, 412b, and 412c and the fourth conductive layer 422a and 422b are formed with graphite. In this way, the second conductive layer 412a, 412b, and 412c has a higher resistance (i.e., a lower conductivity) than the first conductive layer 411, and the fourth conductive layer 422a and 422b has a higher resistance (i.e., a lower conductivity) than the third conductive layer 421. The signal lines 430a, 430b, and 430c have the first conductivity.

The ground plane 410 provides a ground voltage. The power plane 420 provides a power voltage. The signal lines 430a, 430b, and 430c transfer a signal. The ground plane 410, the power plane 420, and the signal lines 430a, 430b, and 430c are separated from each other by a dielectric substance 440.

The substrate 400 includes a fifth conductive layer and a sixth conductive layer between the ground plane 410 and the power plane 420.

The first signal line 430a and the second signal line 430b are placed between the ground plane 410 and the power plane 420 and apart from each other in a horizontal direction and include a fifth conductive layer. The third signal line 430c is placed between the fourth conductive layer 422a and 442b and the power plane 420 and includes a sixth conductive layer.

The second conductive layer 412a, 412b, and 412c having the second conductivity is adjacent to the first conductive layer 411. In addition, the second conductive layer 412a, 412b, and 412c has a void region over which the first signal line 430a and the second signal line 430b are placed. The fourth conductive layer 422a and 422b having the second conductivity is adjacent to the third conductive layer 421. In addition, the fourth conductive layer 422a and 422b has a void region over which the third signal line 430c is placed.

Figure 7:
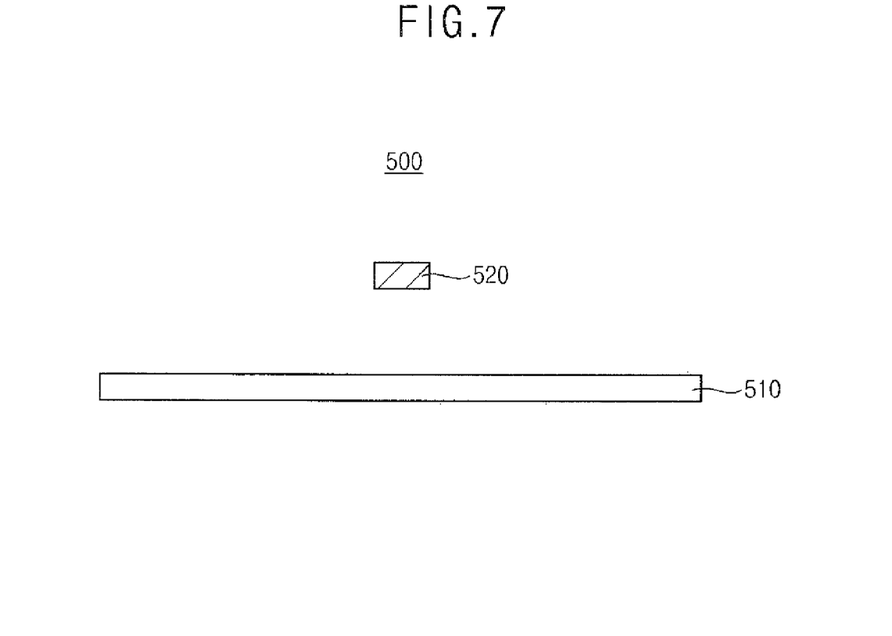
FIG. 7 illustrates a cross-sectional view of a substrate according to an exemplary embodiment of the present invention.

FIG. 7 illustrates a cross-sectional view of a substrate according to an exemplary embodiment of the present invention.

Referring to FIG. 7, the substrate 500 may include a first plane 510 and a signal line 520. The first plane 510 may be a power plane that provides a power voltage or a ground plane that provides a ground voltage.

The substrate 500 has a power net in which no current flows through the signal line 520. For example, a reference voltage may be provided through the signal line 520 in the substrate 500. After the reference voltage applied to the signal line 520 is stabilized, no current flows through the signal line 520. Thus, power consumption is low even if the signal line 520 includes conductive layers having a low conductivity. The first plane 510 includes a first conductive layer having a first conductivity. The signal line 520 may include a second conductive layer having a second conductivity lower than the first conductivity. For example, the first conductivity may be about $5.85 \times 10^7$ (mhos/m) when the first conductive layer 510 is formed with copper and the second conductivity may be about $7.0 \times 10^7$ (mhos/m) when the second conductive layer 520 is formed with graphite. In this way, the second conductive layer in the signal line 520 has a higher resistance (i.e., a lower conductivity) than the first conductive layer in the first plane 510. The first plane 510 and the signal line 520 are separated from each other by a dielectric substance.

The signal line 520 may include a lossy metal having a low conductivity because no direct current flows in the power net of the substrate of FIG. 7. For example, copper may be used for the ground plane 510 and graphite may be used for the signal line 520.

Thus, the substrate of FIG. 7 may suppress the noise of relatively high frequencies along the transmission direction. In other words, the noise, particularly the SSN noise that flows from the signal line 520 into the ground plane 510, may be suppressed because the signal line 520 includes the lossy metal having the low conductivity.

Figure 8:
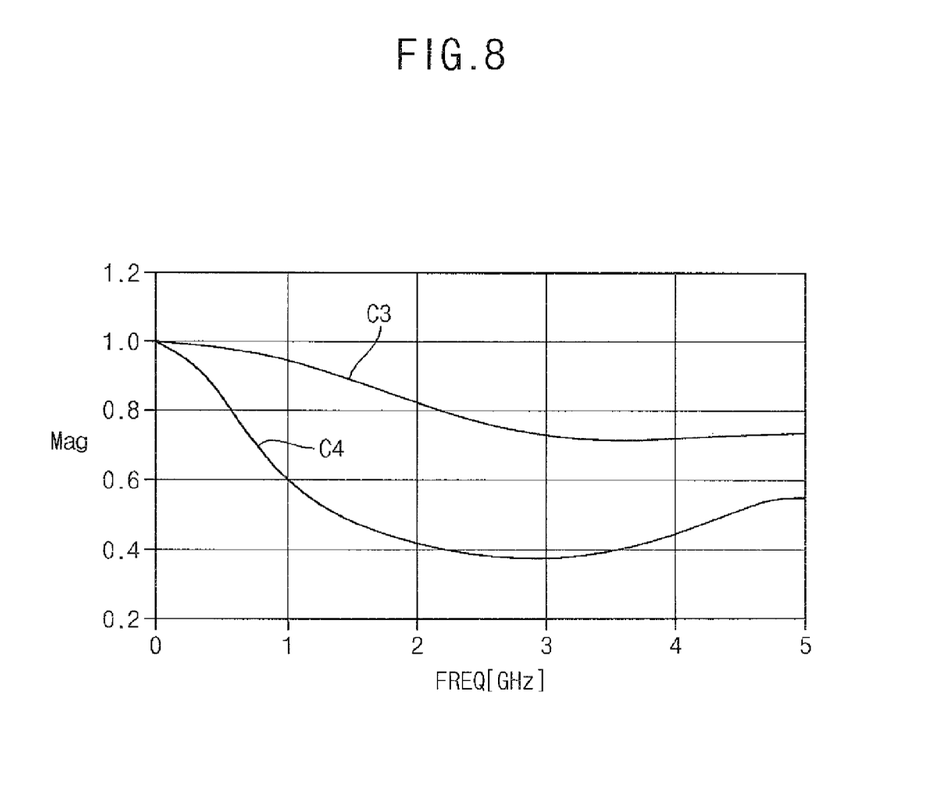
FIG. 8 is a graph illustrating an insertion loss of the substrate of FIG. 7 having signal lines that include a lossy metal according to an exemplary embodiment of the present invention.

FIG. 8 is a graph illustrating an insertion loss of the substrate 500 of FIG. 7 having signal lines that include the lossy metal according to an exemplary embodiment of the present invention.

Referring to FIG. 8, Mag refers to a voltage ratio at both terminals of a power plane and FREQ refers to a measured frequency. C3 refers to the insertion loss of the substrate in which the ground plane and the power plane both include a conductive layer having copper. C4 refers to the insertion loss of the substrate 500 in which the power plane includes a conductive layer having graphite.

In FIG. 8, the insertion loss of the substrate 500 in which the signal line 520 includes the conductive layer having a lower conductivity as compared with the conductive layer in the power plane or the ground plane is greater than the insertion loss of the conventional substrate in which the signal line includes the conductive layer having the same conductivity as the conductivity of the conductive layer in the power plane or the ground plane. Thus, the substrate 500 of FIG. 7 may suppress the noise, particularly the SSN noise.

Figure 9:
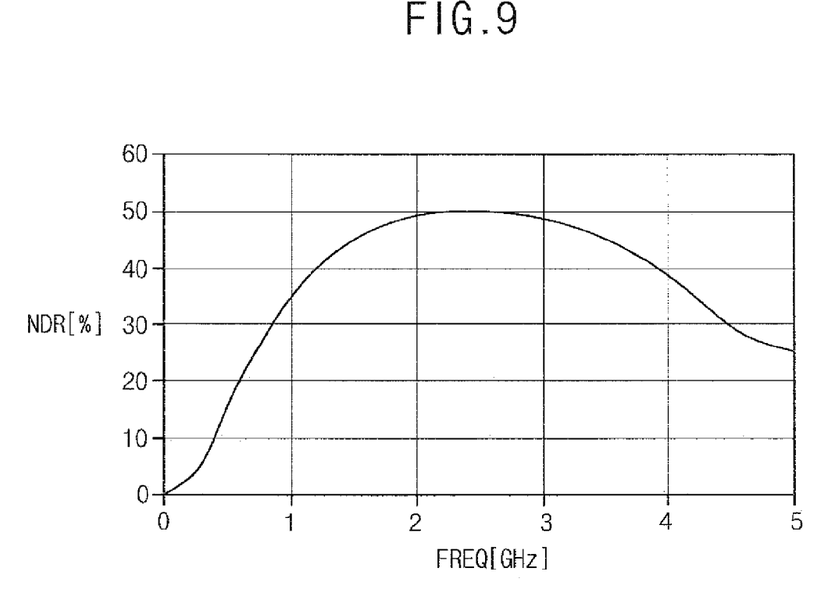
FIG. 9 is a graph illustrating a noise decreasing rate of the substrate of FIG. 7 having signal lines that include a lossy metal according to an exemplary embodiment of the present invention.

FIG. 9 is a graph illustrating a noise decreasing rate of the substrate 500 of FIG. 7 having signal lines that include the lossy metal according to an exemplary embodiment of the present invention.

Referring to FIG. 9, the noise decreasing rate (NDR) has a maximum value at high frequencies of about 2 to about 3 GHz.

Figure 10:
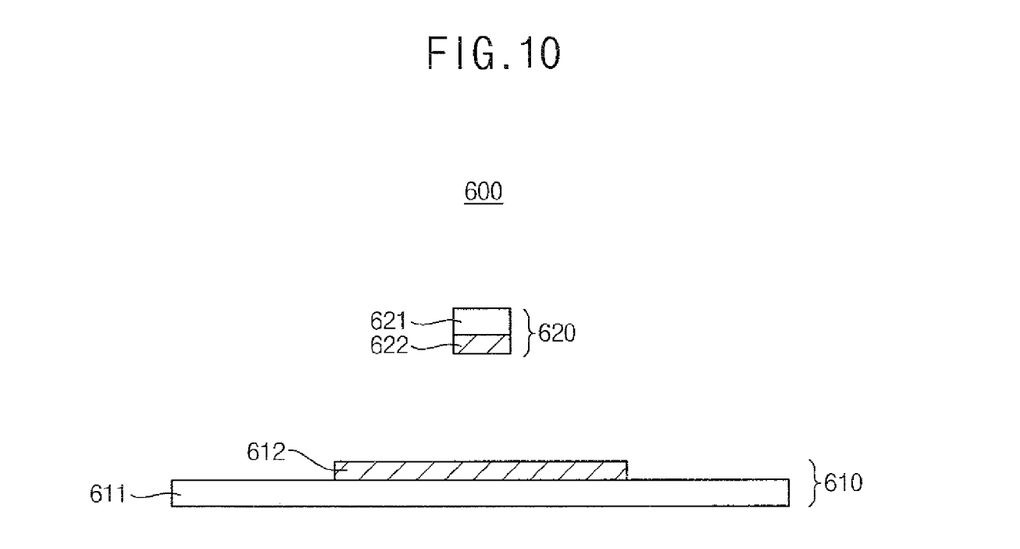
FIG. 10 illustrates a cross-sectional view of a substrate according to an exemplary embodiment of the present invention.

FIG. 10 illustrates a cross-sectional view of a substrate according to an exemplary embodiment of the present invention.

Referring to FIG. 10, the substrate 600 may include a first plane 610 and a signal line 620. The first plane 610 may be a power plane that provides a power voltage or a ground plane that provides a ground voltage.

The substrate 600 has a structure in which no direct current flows through the signal line 620. For example, a reference voltage may be provided through the signal line 620 in the substrate 600. The first plane 610 includes a first conductive layer 611 having a first conductivity and a second conductive layer 612 having a second conductivity lower than the first conductivity. In addition, the second conductive layer 612 is adjacent to the first conductive layer 611. The signal line 620 includes a third conductive layer 621 having the first conductivity and a fourth conductive layer 622 having the second conductivity. In addition, the fourth conductive layer 622 is adjacent to the third conductive layer 621.

For example, the first conductivity may be about $5.85 \times 10^{7}$ (mhos/m) when the first conductive layer 611 and the third conductive layer 621 are formed with copper and the second conductivity may be about $7.0 \times 10^{7}$ (mhos/m) when the second conductive layer 612 and the fourth conductive layer 622 are formed with graphite. In this way, the second conductive layer 612 has a higher resistance (i.e., a lower conductivity) than the first conductive layer 611 and the fourth conductive layer 622 has a higher resistance (i.e., a lower conductivity) than the third conductive layer 621.

The first plane 610 and the signal line 620 are separated from each other by a dielectric substance.

The first plane 610 may include only the first conductive layer 611.

The signal line 620 may include the third conductive layer 621 having the first conductivity and the fourth conductive layer 622 having the second conductivity lower than the first conductivity because no direct current flows in a power net of the substrate of FIG. 10. For example, copper may be used for the third conductive layer 621 and graphite may be used for the fourth conductive layer 622.

Thus, the substrate of FIG. 10 may suppress the noise of relatively high frequencies along the transmission direction. In other words, the noise, particularly the SSN noise that flows from the signal line 620 into the first plane 610, may be suppressed because the signal line 620 includes the conductive layer that includes the lossy metal having the low conductivity.

Figure 11:
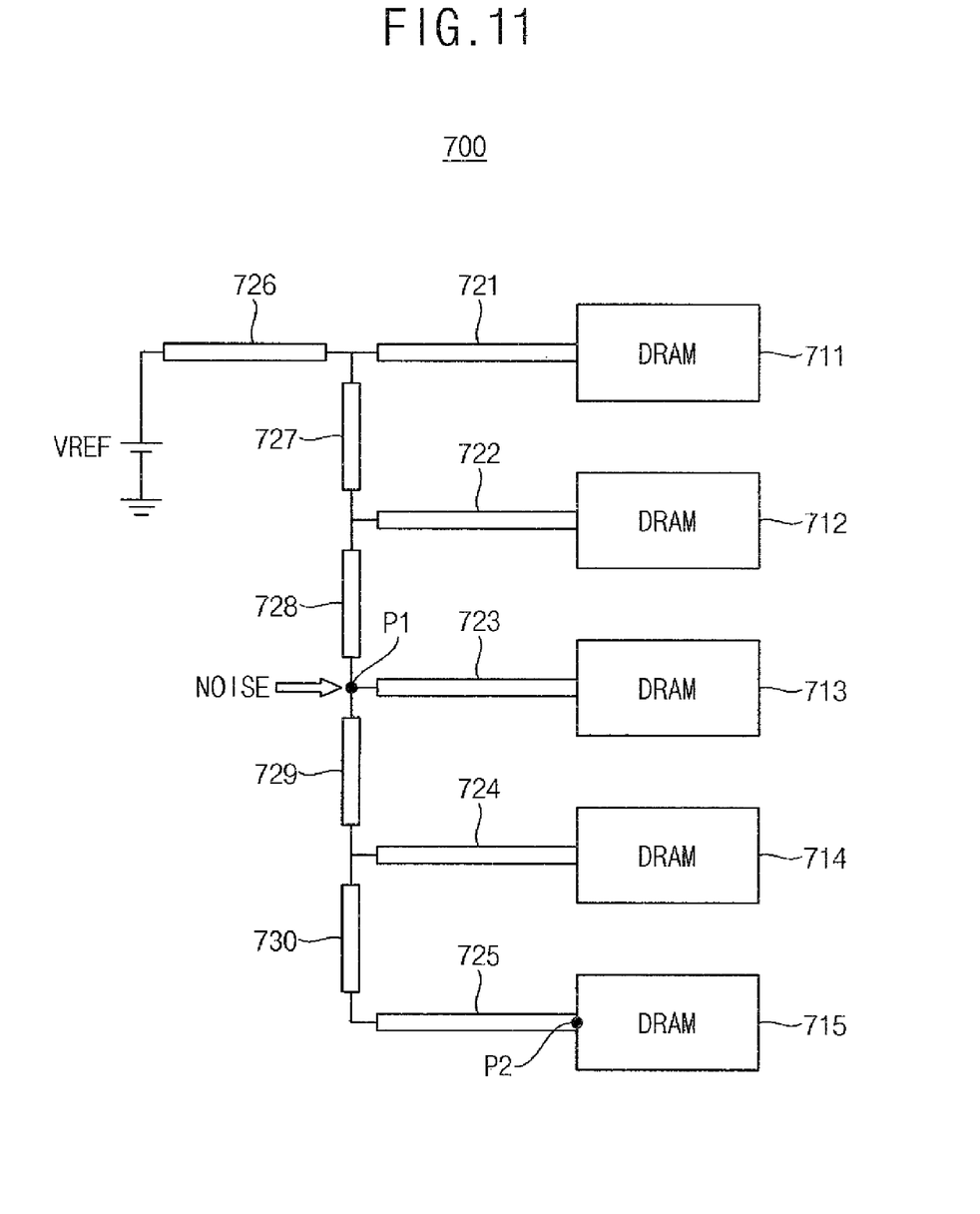
FIG. 11 is a diagram illustrating a memory module according to an exemplary embodiment of the present invention.

FIG. 11 is a diagram illustrating a memory module according to an exemplary embodiment of the present invention.

Referring to FIG. 11, the memory module 700 may include dynamic random access memory (DRAM) devices 711 through 715 and signal lines 721 through 730. A reference voltage VREF is provided to the DRAM devices 711 through 715 through the signal lines 721 through 730. The memory module 700 includes power planes and ground planes in addition to the signal lines 721 through 730. However, the power planes and the ground planes are not illustrated in FIG. 11 for the sake of convenience.

In FIG. 11, the reference voltage VREF is provided to the memory module 700 through the signal lines 721 through 730. However, various signals may be provided to the memory module 700 through the signal lines 721 through 730.

Figure 12:
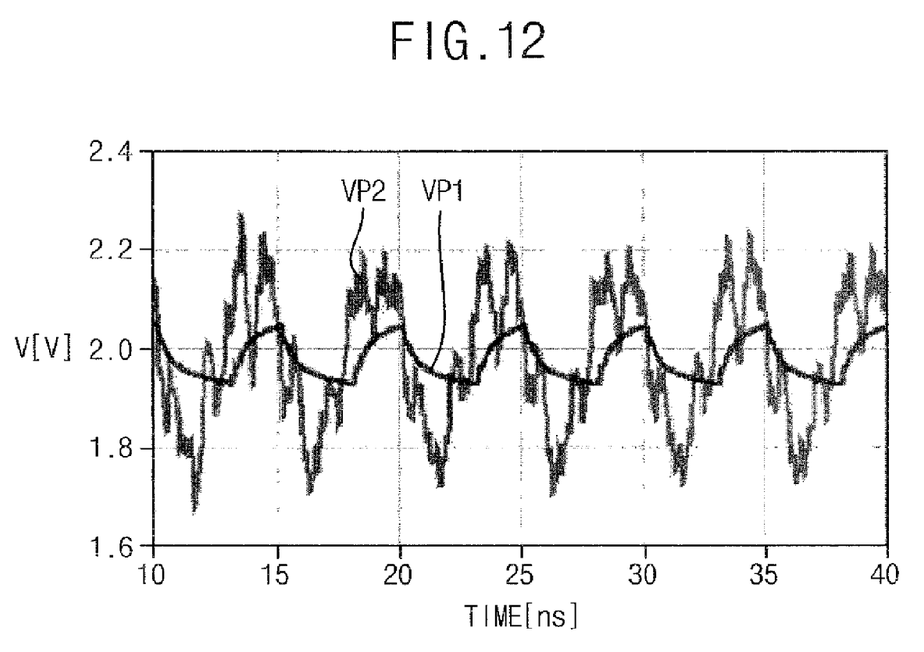
FIG. 12 is a graph illustrating a voltage measured at a point when a noise source was applied to the memory module of FIG. 11.

FIG. 12 is a graph illustrating a voltage measured at a point when a noise source was applied to the memory module 700 of FIG. 11.

Referring to FIG. 12, a voltage measured at a second node P2 where the signal line 725 is coupled to the DRAM device 715 is illustrated when the noise source NOISE is applied to a first node P1 of FIG. 11. A pulse-wave having a period of 5 ns and a peak to peak voltage of 0.1V is used as the noise source NOISE.

In FIG. 12, VP1 refers to a voltage waveform measured at a point of the substrate 500 of FIG. 7 in which the signal line 520 includes the conductive layer having the lower conductivity as compared with the power plane or the ground plane. VP2 refers to a voltage waveform measured at a point of the conventional substrate in which the signal line includes the conductive layer having the same conductivity as the conductivity of the conductive layer in the power plane or the ground plane. As shown in FIG. 12, there is less noise in the memory module using the substrate 500 of the present invention shown in FIG. 7 than in the memory module using the conventional substrate.

Figure 13:
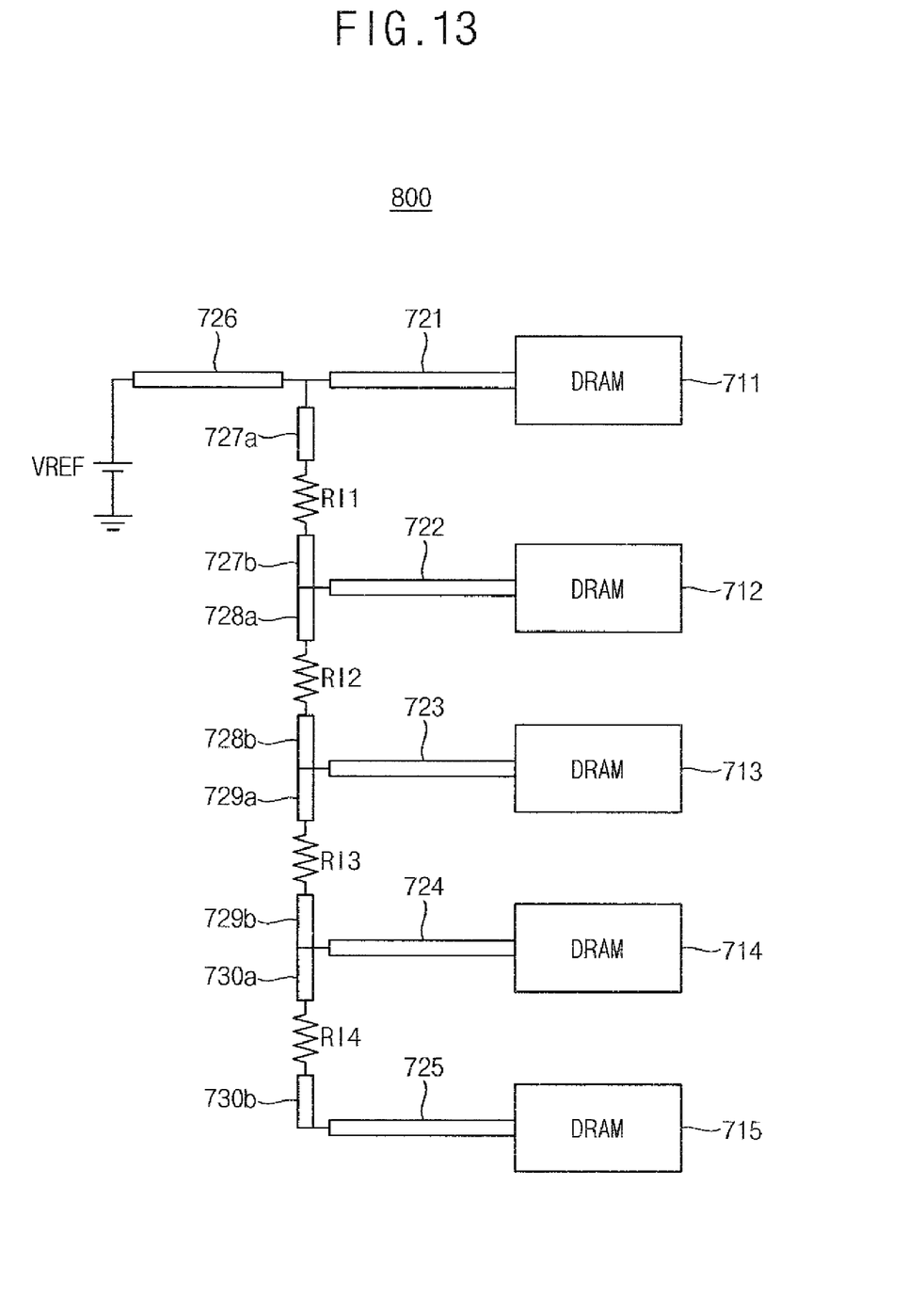
FIG. 13 is a diagram illustrating a memory module according to an exemplary embodiment of the present invention.

FIG. 13 is a diagram illustrating a memory module according to an exemplary embodiment of the present invention.

Referring to FIG. 13, the memory module 800 may include DRAM devices 711 through 715, signal lines 721 through 730, and resistors RI1 through RI4.

A reference voltage VREF is provided to the DRAM devices 711 through 715 through the signal lines 721 through 730. The memory module 800 includes power planes and ground planes in addition to the signal lines 721 through 730. However, the power planes and the ground planes are not illustrated in FIG. 13 for the sake of convenience.

The memory module 800 of FIG. 13 is different from the memory module 700 of FIG. 11. In the memory module 800 of FIG. 13, the signal lines 721 through 730 do not use conductors having a low conductivity. In addition, the resistors RI1 through RI4 are placed between the signal lines 721 through 730. Thus, the memory module 800 may suppress noise because the resistors RI1 through RI4 are placed between the signal lines 721 through 730.

The above-described substrates according to the exemplary embodiments of the present invention may be employed in an electronic system including substrates and semiconductor devices.

Figure 14:
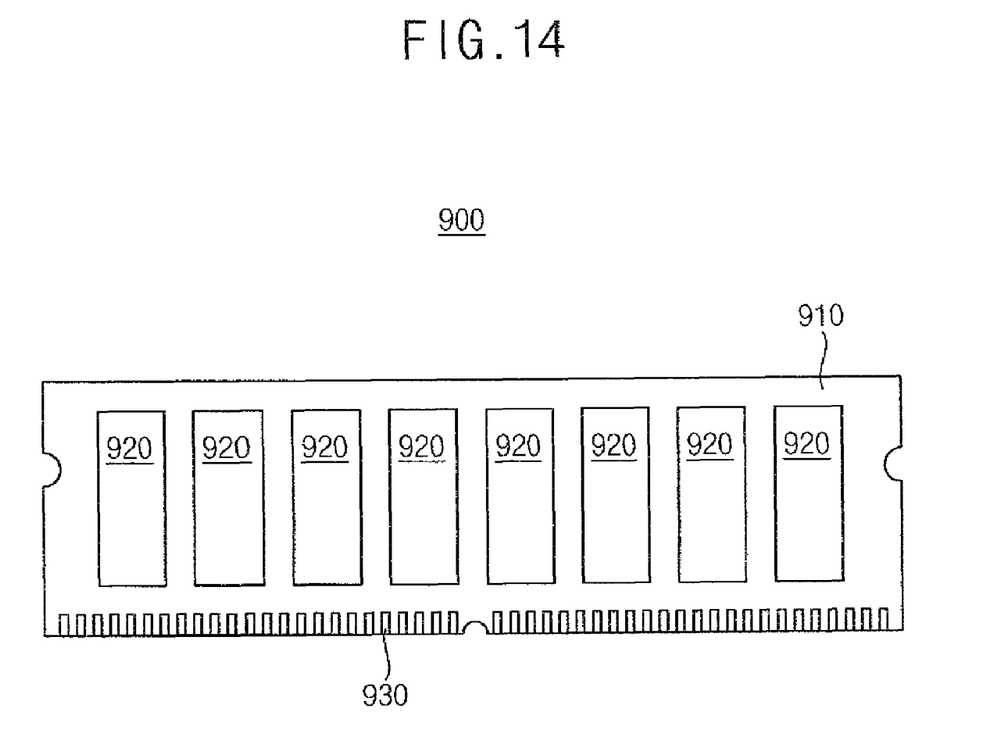
FIG. 14 is a diagram illustrating an electronic system that may include any of the substrates according to the exemplary embodiments of the present invention.

FIG. 14 is a diagram illustrating an electronic system that may include any of the substrates according to the exemplary embodiments of the present invention.

Referring to FIG. 14, the electronic system 900 may include a substrate 910 and semiconductor devices 920. In the electronic system 900 of FIG. 14, the substrate 910 has a power net in which no direct current flows.

The semiconductor devices 920 are placed on the substrate 910. In addition, the semiconductor devices 920 are electrically coupled to each other by a power plane and a ground plane in the substrate 910. The substrate 910 may be any of the substrates according to the exemplary embodiments of the present invention described above. Tabs 930 on the substrate 910 may be combined with sockets of another circuit board.

As described above, the substrates according to the exemplary embodiments of the present invention may prevent the quality degradation of the signal transferred through a signal line by suppressing the noise generated in the power plane and/or the ground plane by including the lossy metal having the low conductivity in the power plane and/or the ground plane. In addition, the substrate having the power net in which no direct current flows may prevent the quality degradation of the signal transferred through the signal line by including the lossy metal having the low conductivity in the signal lines.

The substrates according to the exemplary embodiments of the present invention may be applicable to electronic systems, particularly to memory modules including semiconductor devices.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A substrate, comprising:
a power plane and a ground plane that are placed apart from and are substantially parallel to each other, wherein the ground plane includes a first conductive layer having a first conductivity, the power plane includes a second conductive layer having the first conductivity, and the power plane or the ground plane includes a third conductive layer having a second conductivity lower than the first conductivity; and
at least one signal line that is placed between the power plane and the ground plane, wherein the third conductive layer faces the at least one signal line across a dielectric substance, and
wherein a shortest distance between the at least one signal line and the ground plane is shorter than a shortest distance between the at least one signal line and the power plane, or a shortest distance between the at least one signal line and the power plane is shorter than a shortest distance between the at least one signal line and the ground plane.

2. The substrate of claim 1, wherein a direct current flows through the second conductive layer and the third conductive layer.

3. The substrate of claim 1, wherein an alternating current flows through the third conductive layer.

4. The substrate of claim 3, wherein the alternating current flows through the third conductive layer due to a high frequency skin effect.

5. The substrate of claim 1, wherein the at least one signal line includes:
a first signal line and a second signal line placed in a fourth conductive layer between the ground plane and the power plane, wherein the first signal line and the second signal line are placed apart from each other in a substantially horizontal direction; and
a third signal line placed in a fifth conductive layer between the fourth conductive layer and the ground or power planes.

6. The substrate of claim 5, wherein the ground plane or the power plane further includes:
a sixth conductive layer having the second conductivity, wherein the sixth conductive layer is adjacent to the first conductive layer when the ground plane includes the sixth conductive layer, or is adjacent to the second conductive layer when the power plane includes the sixth conductive layer, and has a void region over which the first signal line and the second signal line are placed.

7. The substrate of claim 5, wherein the third conductive layer has a void region over which the third signal line is placed.

8. A substrate, comprising:
a power plane and a ground plane that are placed apart from and are substantially parallel to each other, wherein the ground plane includes a first conductive layer having a first conductivity, the power plane includes a second conductive layer having the first conductivity, and the power plane or the ground plane includes a third conductive layer having a second conductivity lower than the first conductivity; and
at least one signal line that is placed between the power plane and the ground plane, wherein the third conductive layer faces the at least one signal line across a dielectric substance,
wherein the at least one signal line includes a fourth conductive layer having the first conductivity,
wherein the at least one signal line further includes a fifth conductive layer having the second conductivity, and
wherein the fifth conductive layer is adjacent to the fourth conductive layer and faces the third conductive layer across the dielectric substance.

9. The substrate of claim 8, wherein a direct current flows through the fourth conductive layer and the fifth conductive layer.

10. The substrate of claim 8, wherein an alternating current flows through the fifth conductive layer.

11. A substrate, comprising:
a power plane and a ground plane that are placed apart from and are substantially parallel to each other, wherein the ground plane includes a first conductive layer having a first conductivity, the power plane includes a second conductive layer having the first conductivity, and the power plane or the ground plane includes a third conductive layer having a second conductivity lower than the first conductivity; and
at least one signal line that is placed between the power plane and the ground plane, wherein the third conductive layer faces the at least one signal line across a dielectric substance,
wherein the at least one signal line includes a first signal line and a second signal line that are placed between the power plane and the ground plane and are placed apart from each other in a substantially horizontal direction, and
wherein a shortest distance from the first signal line or the second signal line to the ground plane is shorter than a shortest distance from the first signal line or the second signal line to the power plane, or a shortest distance from the first signal line or the second signal line to the power plane is shorter than a shortest distance from the first signal line or the second signal line to the ground plane.

12. The substrate of claim 11, wherein the ground plane or the power plane further includes a fourth conductive layer having the second conductivity, wherein the fourth conductive layer is adjacent to the first conductive layer when the ground plane includes the fourth conductive layer, or is adjacent to the second conductive layer when the power plane includes the fourth conductive layer, and has a void region over which the first signal line and the second signal line are placed.

13. A substrate, comprising:
a plane that provides a power voltage or a ground voltage, wherein the plane includes a first conductive layer having a first conductivity; and
at least one signal line configured to transfer a signal, wherein the at least one signal line is placed apart from the plane and includes a second conductive layer having a second conductivity lower than the first conductivity, wherein the at least one signal line includes a third conductive layer having the first conductivity, and the third conductive layer is adjacent to the second conductive layer.

14. The substrate of claim 13, wherein the second conductive layer faces the plane across a dielectric substance.

15. An electronic system, comprising:
a substrate including a power plane and a ground plane and at least one signal line, wherein the power plane and the ground plane are placed apart from and are substantially parallel to each other, and wherein the ground plane includes a first conductive layer having a first conductivity, the power plane includes a second conductive layer having the first conductivity, and the ground plane or the power plane includes a third conductive layer having a second conductivity lower than the first conductivity, wherein the at least one signal line is placed between the power plane and the ground plane, and the third conductive layer faces the at least one signal line across a dielectric substance, and wherein a shortest distance between the at least one signal line and the ground plane is shorter than a shortest distance between the at least one signal line and the power plane, or a shortest distance between the at least one signal line and the power plane is shorter than a shortest distance between the at least one signal line and the ground plane; and
a plurality of semiconductor devices electrically coupled to each other through the power plane, the ground plane, and the at least one signal line in the substrate.

16. An electronic system, comprising:
a substrate including a plane and at least one signal line, wherein the plane provides a power voltage or a ground voltage, and wherein the plane includes a first conductive layer having a first conductivity, wherein the at least one signal line is configured to transfer a signal, wherein the at least one signal line is placed apart from the plane and includes a second conductive layer having a second conductivity lower than the first conductivity, and wherein the at least one signal line includes a third conductive layer having the first conductivity, and the third conductive layer is adjacent to the second conductive layer; and
a plurality of semiconductor devices electrically coupled to each other through the plane, and the at least one signal line in the substrate.

17. A substrate, comprising:
a first plane and a second plane that are placed apart from and are substantially parallel to each other, wherein the first plane includes a first conductive layer having a first conductivity, the second plane includes a second conductive layer having the first conductivity, and the second plane or the first plane includes a third conductive layer having a second conductivity lower than the first conductivity; and
at least one signal line that is placed between the first plane and the second plane, wherein the third conductive layer faces the at least one signal line across a dielectric substance, and
wherein a shortest distance between the at least one signal line and the first plane is shorter than a shortest distance between the at least one signal line and the second plane, or a shortest distance between the at least one signal line and the second plane is shorter than a shortest distance between the at least one signal line and the first plane.

18. The substrate of claim 17, wherein the first plane is a ground plane or a power plane.

19. The substrate of claim 17, wherein the second plane is a ground plane or a power plane.

20. The substrate of claim 17, wherein the first plane is a power plane, and the second plane is a ground plane.

21. The substrate of claim 17, wherein the first plane is a ground plane, and the second plane is a power plane.

* * * * *